US009484040B2

(12) United States Patent
Ko

(10) Patent No.: US 9,484,040 B2
(45) Date of Patent: Nov. 1, 2016

(54) AUDIO DECODING METHOD AND ASSOCIATED APPARATUS

(75) Inventor: Chun-Yen Ko, Hsinchu County (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 457 days.

(21) Appl. No.: 13/600,405

(22) Filed: Aug. 31, 2012

(65) Prior Publication Data

US 2013/0317829 A1 Nov. 28, 2013

(30) Foreign Application Priority Data

May 23, 2012 (TW) ............................ 101118384 A

(51) Int. Cl.
*G10L 19/00* (2013.01)
*H03M 13/00* (2006.01)
*G10L 19/16* (2013.01)

(52) U.S. Cl.
CPC .................................... *G10L 19/167* (2013.01)

(58) Field of Classification Search
CPC ..... G10L 19/00; G10L 19/167; H03M 13/00
USPC ................................. 704/211, 500; 714/748
See application file for complete search history.

(56) References Cited

U.S. PATENT DOCUMENTS

2002/0031336 A1* 3/2002 Okada .............. G11B 20/10527 386/245
2002/0165720 A1* 11/2002 Johnson .................. G10L 19/00 704/500
2003/0014705 A1* 1/2003 Suzuki .................. H04L 1/0045 714/748
2003/0103604 A1* 6/2003 Kato .................... G11B 27/034 379/68
2005/0204385 A1* 9/2005 Sull ................... G06F 17/30817 725/45
2005/0234731 A1* 10/2005 Sirivara ................ G10L 19/167 704/500
2006/0149531 A1* 7/2006 Mody ................... G10L 19/167 704/201
2006/0279628 A1* 12/2006 Fleming ............... G11B 27/034 348/143
2007/0223878 A1* 9/2007 Abe ..................... G11B 19/025 386/230
2008/0228472 A1* 9/2008 Park ...................... G10L 19/167 704/211
2009/0044072 A1* 2/2009 Oh ........................ H04L 12/189 714/758
2012/0027131 A1* 2/2012 Sethi ................... H04L 27/2647 375/329

OTHER PUBLICATIONS

Taiwan Office Action, Jul. 3, 2015, 6 pages.

* cited by examiner

*Primary Examiner* — Pierre-Louis Desir
*Assistant Examiner* — Seong Ah A Shin
(74) *Attorney, Agent, or Firm* — Edell, Shapiro & Finnan, LLC

(57) ABSTRACT

An audio decoding method is provided. In the audio decoding method, a synchronization word and a corresponding packet header are inserted at the beginning of each packet data. A position of the packet data is confirmed according to the synchronization word, and the packet data is then decoded according to information in the packet header. Accordingly, when an error occurs during the decoding process, the decoding process skips to a next packet data for decoding to avoid noise. In addition, a packet header can be directly accessed in the situation of a fast-forward operation to obtain decoding information of the packet data to perform audio decoding.

12 Claims, 9 Drawing Sheets

AUDIO DECODING METHOD AND ASSOCIATED APPARATUS

This application claims the benefit of Taiwan application Serial No. 101118384, filed May 23, 2012, the subject matter of which is incorporated herein by reference.

BACKGROUND OF THE INVENTION

1. Field of the Invention

The invention relates in general to an audio decoding method, and more particularly to a method for decoding Windows Media Audio (WMA) data.

2. Description of the Related Art

The Windows Media Audio (WMA), an audio compression format created by MICROSOFT™, features a small file size and high audio quality, and is particularly suitable for Internet streaming and mobile devices. Further, the WMA format also supports Digital Rights Management (DRM), and is thus prevalent in online music stores. Along with the rise of the digital music industry and developments of Internet techniques, and more particularly with the popularity of wireless transmissions and handheld mobile communication devices, the WMA format has been increasingly regarded as one of the mainstream audio compression formats.

FIG. 1 shows a schematic diagram depicting a structure of the WMA format. The WMA format is a type of Advanced Streaming Format (ASF), and a WMA file includes at least a data part and a header part. The data part includes all audio content and consists of multiple successive packet data. The header part includes various types of information of the WMA file, such as a file size, the number of video/audio streams and decoding information of the packet data.

In a conventional solution for decoding a WMA file, the decoding information in the header part is first accessed, followed by successively decoding the packet data in the data part. FIG. 2A shows a schematic diagram of a WMA decoding process performed by a conventional solution. A decoder first reads the header part when performing the decoding process. The header part includes decoding information of all packet data in the data part. The decoder then accordingly decodes the packet data in sequence until a playback operation ends. FIG. 2B shows a schematic diagram depicting a situation of a fast-forward operation during a WMA decoding process performed by a conventional solution. When the fast-forward operation reaches a playback time of a packet data M, the decoder needs to again read the header part containing the decoding information of all the packet data. From the packet data M onwards, the decoder then accordingly decodes the packet data following the packet data M in sequence until the playback operation ends.

It is known from the above descriptions that, when performing a WMA decoding process using the conventional solution, the header part at a forefront of the file is first read regardless of the decoding start time point, and the decoding process is then performed sequentially from that time point onwards according to the decoding information in the header part. It should be noted that, apart from the decoding information, the header part further includes a large amount of information such as a file format, a file cover and copyrights, implying that the header part may have a significant size. For example, in a WMA file with a file size of 1.3 MB, the header has a size of approximately several thousands of bytes.

FIG. 3 shows a flowchart of a decoding process for a WMA file by a conventional solution. The decoding process begins with Step 300, in which the WMA file is analyzed and divided into a header part and a plurality of packet data. In Step S310, decoding information in the header part is obtained by analyzing contents in the header part. In Step S320, the decoding is performed sequentially from the first packet data according to the decoding information. In Step S330 of the decoding process, it is checked whether a fast-forward command is received. Step S340 is performed when the fast-forward command is received, or else Step S350 is performed. In Step S340, a fast-forward message is generated. The fast-forward message contains time information indicative of a playback position after the fast-forward operation. Step S310 is iterated after Step S340, so as to allow the decoder to again analyze the header part according to the time information in the fast-forward message and to obtain the decoding information in the packet data corresponding to the playback position after the fast-forward operation. Step S320 is again performed to decode onwards from the packet data corresponding to the playback position after the fast-forward operation. In Step S350, when the fast-forward command is not received, it is checked whether the decoding of the current packet data is complete. Step S320 is iterated to continue decoding the current packet data when the decoding of the current packet data is incomplete, or else Step S360 is performed when the decoding of the current packet data is complete. In Step S360, it is determined whether the current packet is the last packet. Step S320 is iterated to continue decoding a next packet data when the current packet is not the last packet, or else Step S370 is performed to end the decoding process when the current packet is the last packet.

In the foregoing decoding process performed by the conventional solution, because the packet data are successively transmitted to the decoder, the decoder needs to read the border positions of each of the packets from the information of the entire header part. However, since the information in the header part comes in a quite large size, a considerable amount of time is needed for analyzing the header part in order to obtain the required information. Consequently, in the occurrence of an error during the decoding process, the decoder is incapable of timely and correctly determining the border positions of the packet, such that no remedial measures can be taken to eventually lead to successive noises caused by successive decoding errors. Further, regardless of the start time point for decoding (including the situation of a fast-forwarding operation), the decoding information in the header part needs to be re-read. As the head part contains a large amount of content, the decoding information can only be obtained by sacrificing a certain period of time for reading and analyzing the header part. Moreover, an additional period of time is also needed for again finding the packet data to be decoded from the data part according to the decoding information. In conclusion, the conventional solution suffers from two noticeable drawbacks—user experience is undesirably affected by the successive noise resulting from decoding errors, and a longer period of time is required for correct decoding in a situation of a fast-forward operation.

SUMMARY OF THE INVENTION

The invention is directed to an audio decoding method capable of preventing outputting noise in the event of an error during a decoding process as well as more spontaneously starting to decode in a situation of a fast-forward operation.

According to an embodiment of the present invention, an audio decoding method is provided. The audio decoding method includes steps of: dividing an audio data to a header part and a data part; determining a first packet data from the data part according to information in the header part; generating a first packet header corresponding to the first packet data according to the information in the header part; generating a first intermediate data according to a synchronization word, the first packet header and the first packet data; and detecting the synchronization word in the first intermediate data to confirm a position of the first packet data, and decoding the first packet data according to the first packet header.

In a preferred embodiment of the present invention, the above audio decoding method further includes steps of: detecting whether an error occurs in the decoding process, and generating an error message when the error occurs; determining a second packet data from the data part according to the information in the header part and the error message; generating a second packet header corresponding to the second packet data according to the information in the header part; generating a second intermediate data according to the synchronization word, the second packet header and the second packet data; and detecting the synchronization word in the second intermediate data, and decoding the second packet data according to the second packet header. Thus, when an error occurs in the decoding process, a next packet data of the packet data with the error is directly selected for decoding to prevent outputting noises.

In another preferred embodiment of the present invention, the above audio decoding method further includes steps of: detecting whether a fast-forward command is received during the decoding process, and generating a fast-forward message when the fast-forward command is received; determining a third packet data from the data part according to the information in the header part and the fast-forward message; generating a third packet header corresponding to the third packet data according to the information in the header part; generating a third intermediate data according to the synchronization word, the third packet header and the third packet data; and detecting the synchronization word in the third intermediate data, and decoding the third packet data according to the third packet header. Thus, when a fast-forward command is received during the decoding process, a packet data is directly determined, and the packet data is decoded according to decoding information in a packet header in front of the packet data, thereby eliminating the time needed for re-reading the decoding information in the header part.

According to another embodiment of the present invention, an audio decoding apparatus is provided. The apparatus includes an analyzing unit, a packet header inserting unit and a decoding unit. The analyzing unit divides an audio data into a header part and a data part. The packet header inserting unit determines a first packet data from the data part according to information in the header part, generates a first packet header corresponding to the first packet data according to the information in the header part, and generates a first intermediate data according to a synchronization word, the first packet header and the first packet data. The decoding unit detects the synchronization word in the first intermediate data to confirm a position of the first packet data, and decodes the first packet data according to the first packet header.

In a preferred embodiment of the present invention, the above audio decoding apparatus further includes a detecting unit. The detecting unit detects whether an error occurs during the decoding process, generates an error message when the error occurs, detects whether a fast-forward command is received during the decoding process, and generates a fast forward message when the fast-forward command is received. Thus, when an error occurs in the decoding process, a next packet data of the packet data with the error is directly selected for decoding to prevent outputting noises. In addition, when a fast-forward command is received during the decoding process, a packet data is directly determined, and the packet data is decoded according to decoding information in a packet header in front of the packet data, thereby eliminating the time needed for re-reading the decoding information in the header part.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
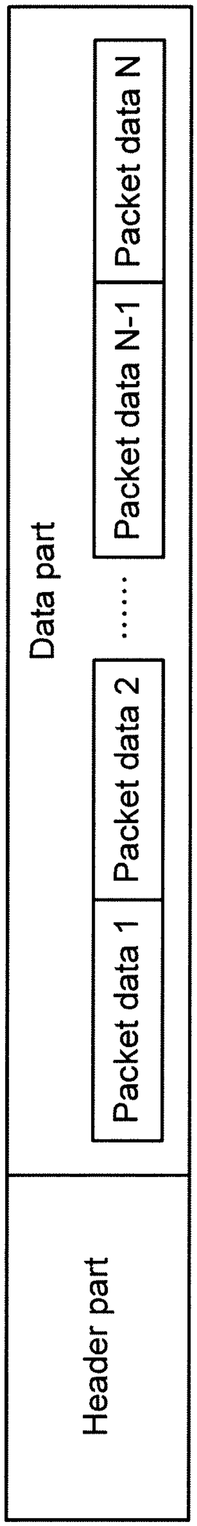
FIG. 1 is a schematic diagram of a structure of a WMA format.
Figure 2A:
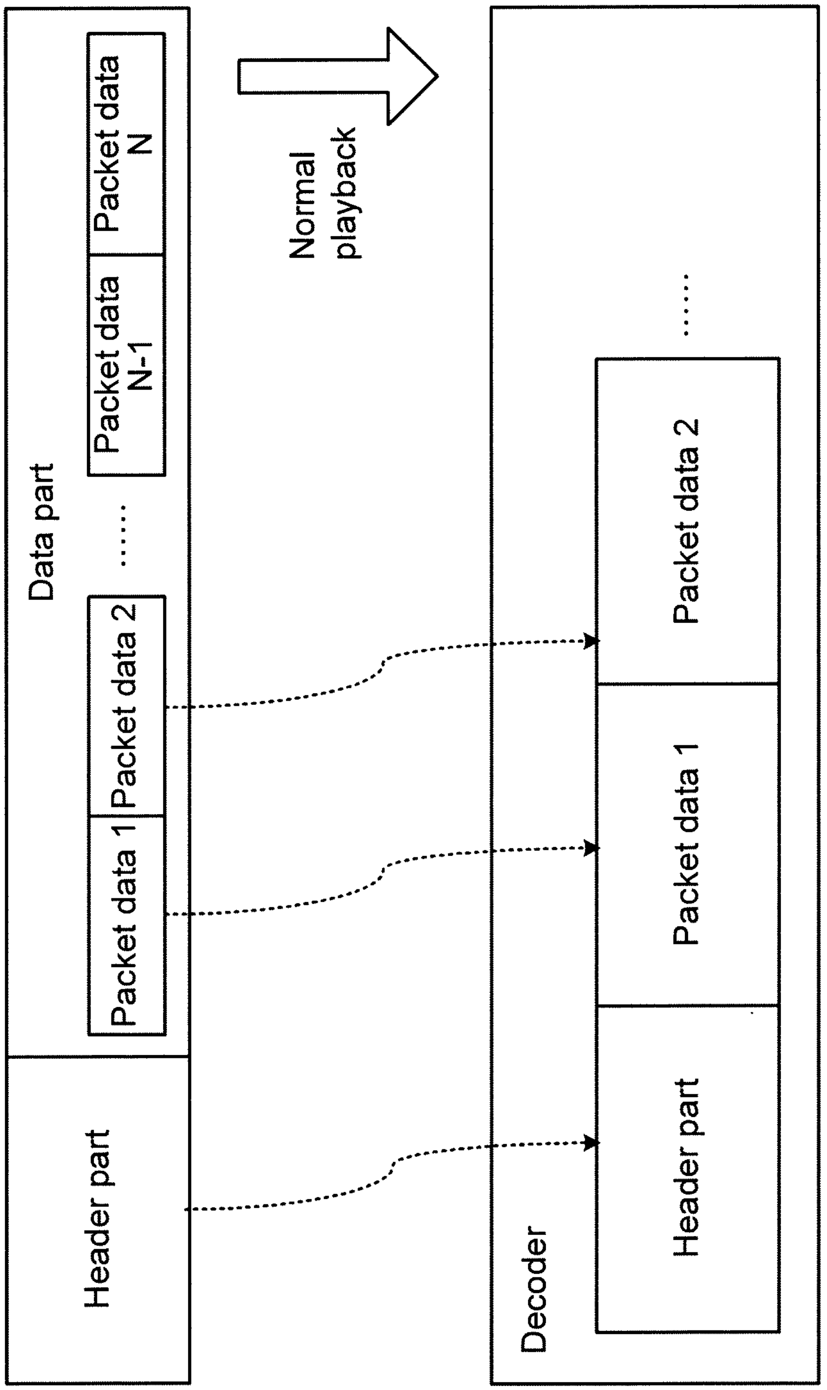
FIG. 2A (prior art)
FIG. 2A is a schematic diagram of a WMA decoding process performed by a conventional solution.
Figure 2B:
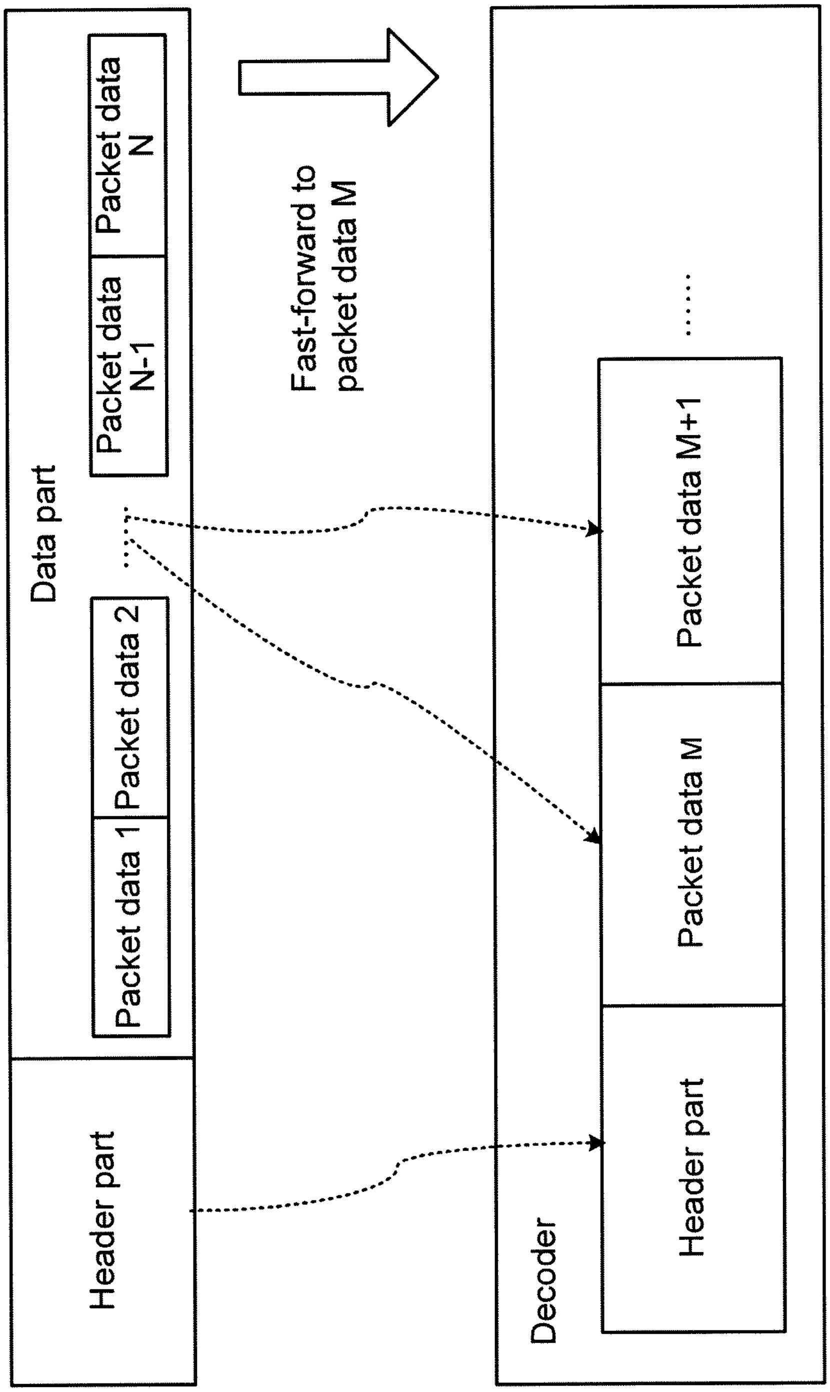
FIG. 2B (prior art)
FIG. 2B is a schematic diagram depicting a situation of a fast-forward operation during a WMA decoding process performed by a conventional solution.
Figure 3:
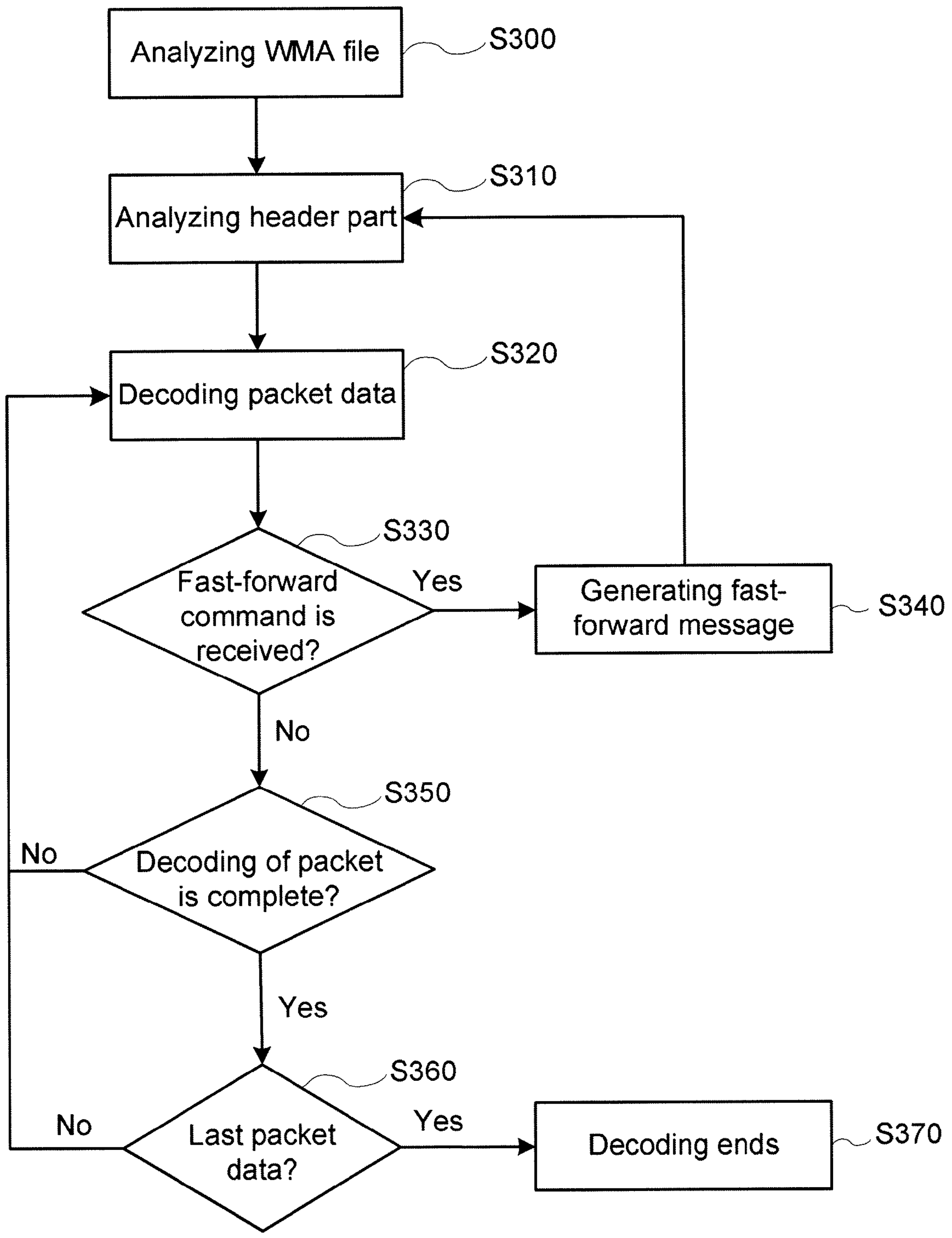
FIG. 3 (prior art)
FIG. 3 is a flowchart of a decoding process for a WMA file in a conventional solution.
Figure 4A:
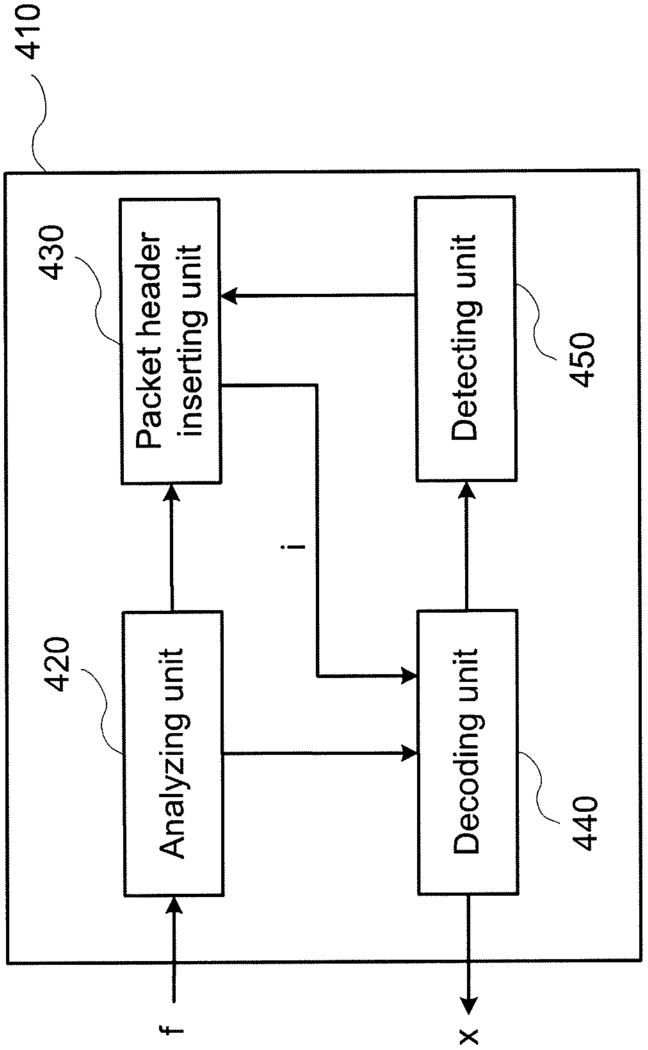
FIG. 4A is a block diagram of an audio decoding apparatus according to an embodiment of the present invention.

FIG. 4A shows a block diagram of an audio decoding apparatus according to an embodiment of the present invention. An audio decoding apparatus 410 includes an analyzing unit 420, a packet header inserting unit 430, a decoding unit 440 and a detecting unit 450. The analyzing unit 420 analyzes data in a WMA file f, divides the file f into a header part and a data part, and sends the header part and the data part to the packet header inserting unit 430. The header part includes a plurality of sets of packet data border information and a plurality of sets of decoding information; the data part includes a plurality of successive packet data. According to information in the header part and the data part, the packet header inserting unit 430 inserts a predefined synchronization word and a packet header corresponding to a packet data to a beginning of each packet data to generate an intermediate data i, and sends the intermediate data i to the decoding unit 440 for decoding. Each packet header contains information needed for decoding the corresponding packet data. After receiving the intermediate data i, the decoding unit 440 finds a correct position of the packet header and the packet data by detecting the synchronization word, and decodes the packet data according to the decoding information in the packet header. In the event of an error during the decoding process, the decoding unit 440 stops decoding and sends an error notification to the detecting unit 450. The detecting unit 450 identifies a type of the error and generates a corresponding message back to the packet header inserting unit 430 for determining a subsequent operation. Further, the detecting unit 450 also at all times detects whether a fast-forward command is received, and generates a corresponding fast-forward message back to the packet header inserting unit 430 for determining a subsequent operation when the fast-forward command is received.

Figure 4B:
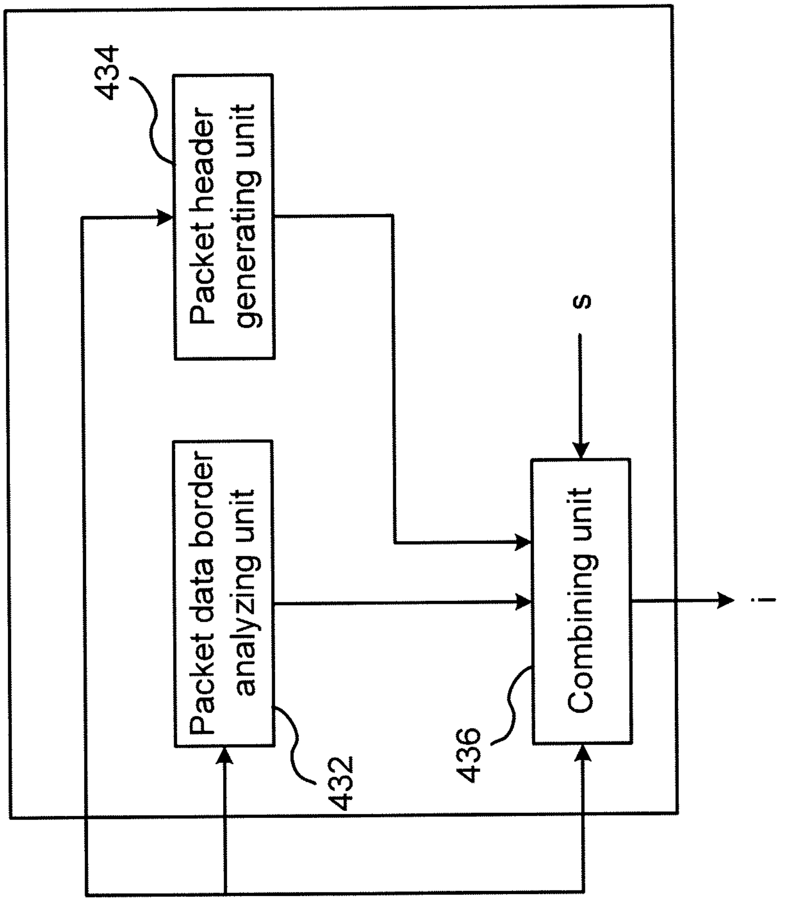
FIG. 4B is a block diagram of a packet header inserting unit in the audio decoding apparatus in FIG. 4A according to an embodiment of the present invention.
Figure 5A:
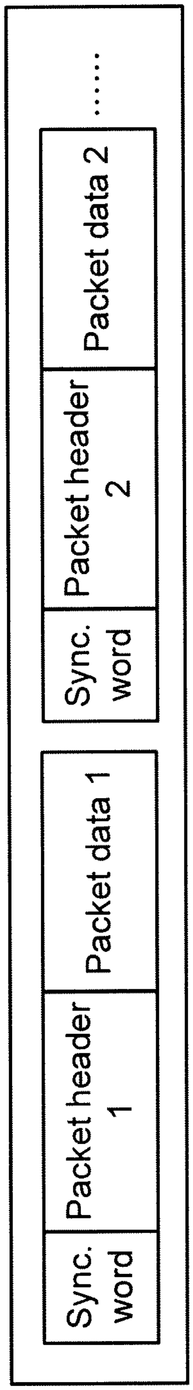
FIG. 5A is a schematic diagram of a structure of an intermediate data of the present invention.

FIG. 4B shows a block diagram of a packet header inserting unit in the audio decoding apparatus in FIG. 4A according to an embodiment of the present invention. The packet header inserting unit 430 includes a packet data border analyzing unit 432, a packet header generating unit 434 and a combining unit 436. According to packet data border information in the header part, e.g., a bit count of each packet data, the packet data border analyzing unit 432 determines borders of each packet data from the data part, so as to allow the audio decoding apparatus of the present invention to identify borders between different packet data in the multiple originally successively arranged packet data. According to the information in the header part, the packet header generating unit 434 generates a plurality of packet headers each containing decoding information, e.g., a channel number, a sampling frequency, a byte count transmitted per second, a byte count of each block, and encoding options, for the corresponding packet data. In addition, the packet headers one-on-one correspond to the packet data for the decoding unit 440 to accordingly decode the packet data. To reduce the size of the packet headers, the packet header generating unit 434 only places the decoding information needed for decoding one packet data into the corresponding packet header. Taking a 1.3 MB WMA file for example, the size of each packet header is around tens of bytes, and a significant amount of time is saved by reading and analyzing the packet headers in the size of tens of bytes instead of reading header parts in thousands of bytes in the conventional solution. For each packet data, the combining unit 436 generates the intermediate data i based on a predefined synchronization word s, the packet header and the packet data corresponding to the packet according to a predetermined sequence, and sends the intermediate data i to the decoding unit 440 for decoding. FIG. 5A shows a schematic diagram depicting a structure of the intermediate data i of the present invention. As shown in FIG. 5A, at the beginning of each packet data, the synchronization word s and the packet header corresponding to the packet data are inserted.

Figure 4C:
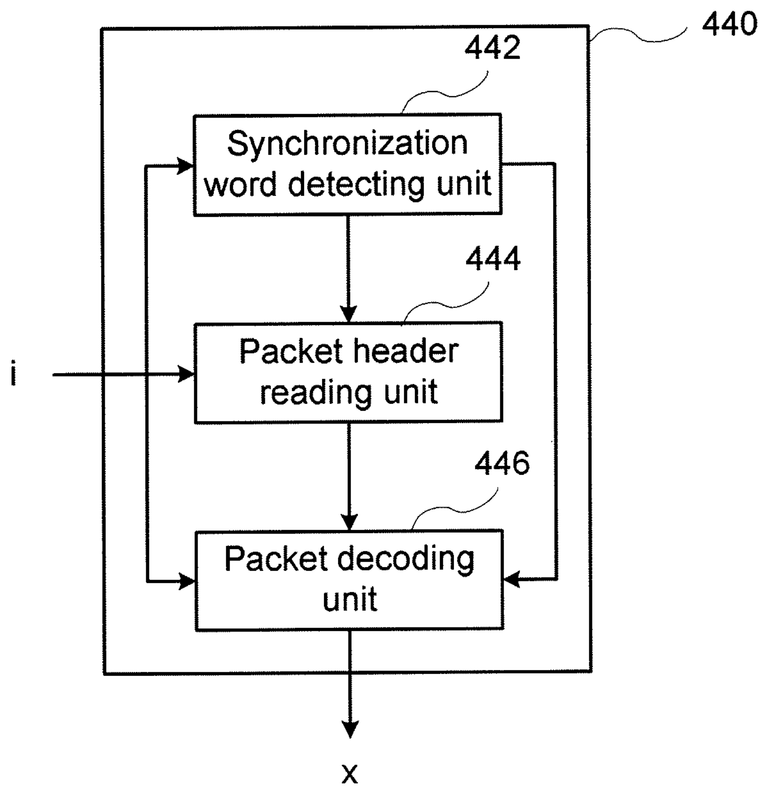
FIG. 4C is a block diagram of a decoding unit in the audio decoding apparatus in FIG. 4A according to an embodiment of the present invention.

FIG. 4C shows a block diagram of a decoding unit in the audio decoding apparatus in FIG. 4A according to an embodiment of the present invention. The decoding unit 440 includes a synchronization word detecting unit 442, a packet header reading unit 444 and a packet decoding unit 446. The synchronization word detecting unit 442 finds the intermediate data i according to the synchronization word s, and accordingly learns start and end positions of the packet header in the intermediate data i as well as a start position of the packet data. After confirming the position of the packet header, the packet header reading unit 444 obtains the decoding information of the packet data from the packet header, and learns an end position of the packet data from the decoding information of the packet data. The packet decoding unit 446 then decodes the packet data according to the decoding information of the packet data, and outputs a data x. When an error occurs during the decoding process, the packet decoding unit 446 immediately stops decoding the packet data and sends an error notification to the detecting unit 450.

Figure 4D:
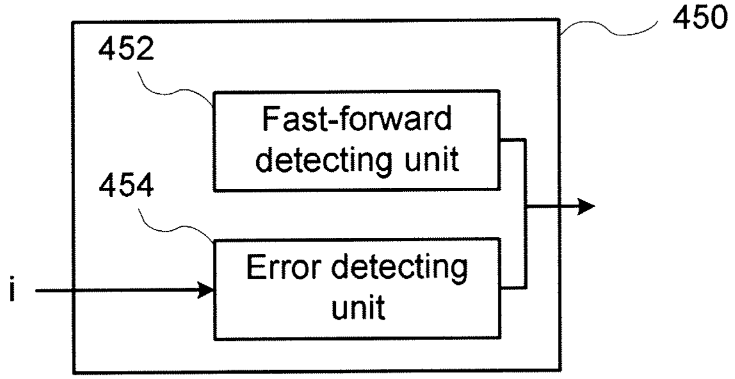
FIG. 4D is a block diagram of a detecting unit in the audio decoding apparatus in FIG. 4A according to an embodiment of the present invention.

FIG. 4D shows a detecting unit in the audio decoding apparatus in FIG. 4A according an embodiment of the present invention. The detecting unit 450 includes a fast-forward detecting unit 452 and an error detecting unit 454. The fast-forward detecting unit 452 detects whether a fast-forward command is received, and generates a fast-forward message when the fast-forward command is received. The fast-forward message contains time information of a position after the fast-forward operation. The fast-forward detecting unit 452 sends the fast-forward message to the packet header inserting unit 430. According to the time information in the fast-forward message, the packet header inserting unit 430 finds the corresponding packet data after the fast-forward operation to accordingly generate the intermediate data i, and sends the intermediate data i to the decoding unit 440. That is to say, the next synchronization word s found by the synchronization detecting unit 442 is the intermediate data i corresponding to the position after the fast-forward operation, and the subsequent decoding begins onwards from the position after the fast-forward operation. The error detecting unit 454 receives the error notification sent by the packet decoding unit 446, and identifies the type of the error that occurred during the decoding process. The error is mainly categorized into two types. A first type is an error in the size of the packet, when the size of the packet is found to be different by the error detecting unit 446 from the information listed in the packet header. The other type is a miscellaneous error that occurs during the decoding process performed by the packet decoding unit 446. For example, a predetermined debugging bit is provided in the packet data of the intermediate data i, and is detected during the decoding process to determine whether an error exists in the packet data. For another example, the error may be that a decoded maximum packet size is reached by the decoding unit 446 and the decoding is yet incomplete, or the decoding process is completed by the decoding unit 446 and yet the expected packet size is not fulfilled. When it is determined that an error in the packet size occurs, the error detecting unit 454 generates an error message to the packet header inserting unit 430. The error message contains termination information, which prompts the packet header inserting unit 430 to stop sending the intermediate data i to the decoding unit 440. Thus, all the packet data are skipped and the decoding process ends. When it is determined that a miscellaneous error occurs, the error detecting unit 454 similarly generates an error message to the packet header inserting unit 430. The error message contains time information, which prompts the packet header inserting unit 430 to immediately send a next intermediate data i to the decoding unit 440. That is to say, the next synchronization word s found by the synchronization word detecting unit 442 is the next intermediate data i, and the subsequent decoding begins onwards from the next packet data.

Figure 6:
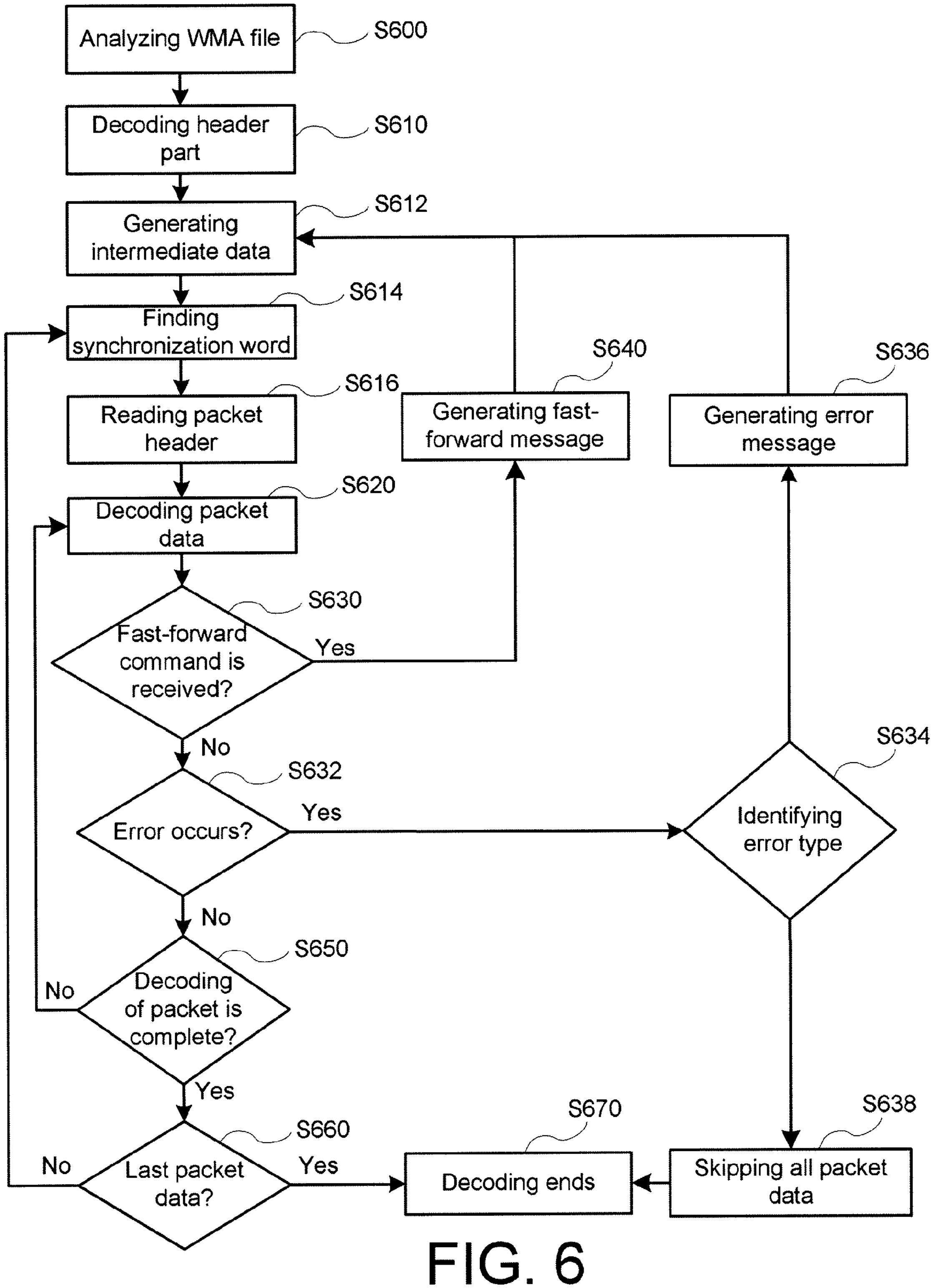
FIG. 6 is a flowchart of an audio decoding method according to an embodiment of the present invention.

FIG. 6 shows a flowchart of an audio decoding method according to an embodiment of the present invention. A decoding process begins with Step S600, in which the analyzing unit 420 analyzes a WMA file, and accordingly divides the WMA file into a header part and a data part. In Step S610, the packet data border analyzing unit 432 and the packet header generating unit 434 analyze information in the header part, and accordingly determine borders of each packet data and a corresponding packet header. In Step S612, the combining unit 436 inserts a synchronization word s and the corresponding packet header to the beginning of each packet data to generate an intermediate data i. After sending the intermediate data i to the decoding unit 440, Step S614 is performed. In Step S614, the synchronization word detecting unit 442 finds the synchronization word s to confirm positions of the packet header and the packet data. In Step S616, the packet header reading unit 444 reads the packet header to obtain decoding information of the packet data. In Step S620, the packet decoding unit 446 decodes the packet data according to the decoding information.

Figure 5B:
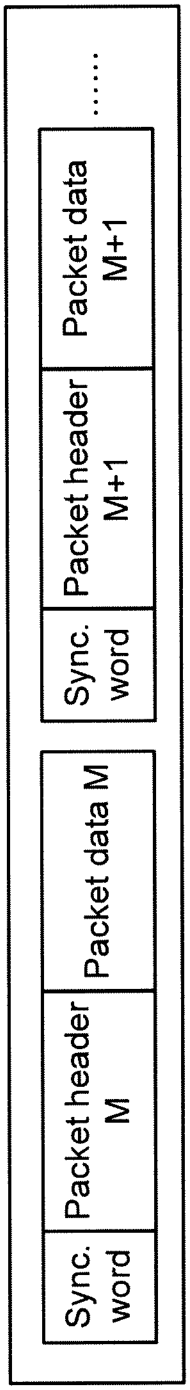
FIG. 5B is a schematic diagram of a structure of an intermediate data generated when fast-forwarding to a packet header M in the present invention.

In Step S630 of the decoding process, the fast-forward detecting unit 452 detects whether a fast-forward command is received. Step S640 is performed when the fast-forward command is received, or else Step S632 is performed. In Step S640, the fast-forward detecting unit 452 generates a fast-forward message containing time information, and sends the fast-forward message to the packet header inserting unit 430. Step S612 is then iterated, in which the packet header inserting unit 430 finds the packet data after the fast-forward operation according to the time information in the fast-forward message, accordingly generates an intermediate data i, and sends the intermediate data i back to the synchronization word detecting unit 442. In Step S614, the synchronization word detecting unit 442 confirms the position of the packet to be decoded after the fast-forward operation, followed by repeating the decoding process. FIG. 5B shows a schematic diagram of a structure of an intermediate data generated when fast-forwarding to a packet header M in the present invention. To reach the packet header M after the fast-forward operation, the fast-forward detecting unit 452 sends the message back to the packet header inserting unit 430, which then generates an intermediate data starting from the packet data M. Each packet data includes a synchronization word and a corresponding packet header. In Step S632, it is determined whether an error occurs during the decoding process. Step S650 is performed when the error does not occur during the decoding process, or else Step S634 is performed to immediately stop decoding the current data, and an error message is sent to the error detecting unit 454 to identify the type of the error. Step S638 is performed when the error detecting unit 454 determines that the error is a packet size error in Step S634, or else Step S636 is performed when the error detecting unit determines that the error is a miscellaneous error. In Step S638, the error detecting unit 454 generates an error message containing time information, and sends the error message back to the packet header inserting unit 430 to prompt the packet header inserting unit 430 to stop sending the intermediate data i to the decoding unit 440. That is, in Step S638, all packet data are skipped to end the decoding process in Step S670. In Step S636, the error detecting unit 454 generates an error message to the packet header inserting unit 430. The error message contains time information to prompt the packet header inserting unit 430 to perform Step S612 to send a next intermediate data i to the decoding unit 440. Step S614 is then iterated to repeat the decoding process.

In Step S650, it is confirmed whether decoding of the current packet is complete. Step S620 is performed when the decoding is yet incomplete to continue decoding the current packet, or else Step S660 is performed when the decoding is complete. In Step S660, it is confirmed whether the current packet is the last packet. Step S670 is performed when it is confirmed that the current packet is the last packet, or else Step S614 is performed when the current packet is not the last packet. In Step S614, the synchronization word detecting unit 442 searches for the next synchronization words to confirm the position of the next packet data, followed by iterating the decoding process. The decoding process ends in Step S670.

It is known from the above descriptions that, the corresponding packet header is placed at the beginning of the packet data. Therefore, when decoding a WMA file using the present invention, in situation of a fast-forward operation, the decoding information is obtained by directly reading the corresponding packet header containing information needed for decoding the packet data instead of re-reading the large-size header part containing all kinds of other information that is not essential for decoding the packet data, thereby effectively reducing a processing time. Moreover, since each packet data includes the synchronization word and the corresponding packet header, the next packet data is directly found for decoding through the synchronization word in the occurrence of an error, and the erroneous part can be skipped to prevent outputting successive noises that undesirably effect user experiences. It should be noted that, the audio decoding apparatus of the present invention is not limited to applications of the WMA file, and may also be applied for decoding other audio file formats such as Adaptive Multi-Rate compression (AMR) or Ogg Vorbis file formats.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An audio decoding method, the method comprising:

dividing, in an audio decoding apparatus of a windows media audio (WMA) file playback apparatus, an audio data into a header part and a data part;

determining a first packet data from the data part according to the header part, wherein the first packet data is a part of the data part and a data size of the first packet is smaller than a data size of the data part;

generating a first packet header corresponding to the first packet data according to the header part, a data size of the first packet header is smaller than a data size of the header part, and the first packet header is different from the header part;

inserting a predefined synchronization word and the first packet header at a beginning of the first packet data to generate a first intermediate data;

detecting the synchronization word in the first intermediate data to confirm a position of the first packet data, and decoding the first packet data according to the first packet header;

detecting whether a fast-forward command is received during decoding process, and generating a fast-forward message when the fast-forward command is received;

determining a third packet data from the data part according to the information in the header part and the fast-forward message;

generating a third packet header corresponding to the third packet data according to the information in the header part;

generating a third intermediate data according to the synchronization word, the third packet header and the third packet data; and detecting the synchronization word in the third intermediate data, and decoding the third packet data according to the third packet header, wherein steps subsequent to receiving, and executing, the fast-forward command are all performed without re-reading the header part.

2. The method according to claim 1, wherein the header part comprises a plurality of sets of packet data border information and a plurality of sets of decoding information.

3. The method according to claim 2, wherein the step of determining the first packet data from the data part according to the information in the header part determines the first packet data according to the sets of packet data border information.

4. The method according to claim 2, wherein the step of generating the first packet header corresponding to the first packet data according to the information in the header part generates the first packet header according to the sets of decoding information.

5. The method according to claim 1, wherein the first packet header only corresponds to decoding information needed for decoding the first packet data.

6. The method according to claim 1, further comprising:

detecting whether an error occurs during a decoding process, and generating an error message when the error occurs;

determining a second packet data from the data part according to the information in the header part and time information in the error message;

generating a second packet header corresponding to the second packet data according to the information in the header part;

generating a second intermediate data according to the synchronization word, the second packet header and the second packet data; and detecting the synchronization word in the second intermediate data, and decoding the second packet data according to the second packet header.

7. An audio decoding apparatus of a mobile communications device windows media audio (WMA) file playback apparatus, comprising:

an analyzer that divides an audio data into a header part and a data part;

a packet header inserter that determines a first packet data from the data part according to the header part, wherein the first packet data is a part of the data part and a data size of the first packet is smaller than a data size of the data part, generates a first packet header corresponding to the first packet data according to the header part, wherein a data size of the first packet header is smaller than a data size of the header part, and the first packet header is different from the header part, and inserts a predefined synchronization word and the first packet header at a beginning of the first packet data to generate a first intermediate data;

a decoder that detects the synchronization word in the first intermediate data to confirm a position of the first packet data, and decodes the first packet data according to the first packet header; and a detector that detects whether a fast-forward command is received during the decoding process, and generates a fast-forward message when the fast-forward command is received, wherein the audio decoding apparatus is configured to:

determine a third packet data from the data part according to the information in the header part and the fast-forward message;

generating a third packet header corresponding to the third packet data according to information in the header part;

generate a third intermediate data according to the synchronization word, the third packet header and the third packet data; and detect the synchronization word in the third intermediate data, and decode the third packet data according to the third packet header, wherein operations subsequent to receiving, and executing, the fast-forward command are all performed without re-reading the header part.

8. The apparatus according to claim 7, wherein the header part comprises a plurality of sets of packet data border information and a plurality of sets of decoding information.

9. The apparatus according to claim 8, wherein the packet header inserter comprises:

a packet data border analyzer that determines the first packet data according to the sets of packet data border information;

a packet header generator that generates the first packet header according to the sets of decoding information; and a combiner that generates the first intermediate data according to the synchronization word, the first packet header and the first packet data.

10. The apparatus according to claim 7, wherein the decoder comprises:

a synchronization word detector that detects the synchronization word in the first intermediate data;

a packet header reader that obtains contents of the first packet header in the first intermediate data; and a packet decoder that decodes the first packet data according to the contents of the first packet header.

11. The apparatus according to claim 7, wherein the first packet header only corresponds to the decoding information needed for decoding the first packet data.

12. The apparatus according to claim 7, further comprising:

a detector that detects whether an error occurs during the decoding process;

generates an error message when the error occurs;

determines a second packet data from the data part according to the information in the header part and time information in the error message;

generates a second packet header corresponding to the second packet data according to the information in the header part;

generates a second intermediate data according to the synchronization word, the second packet header and the second packet data; and detects the synchronization word in the second intermediate data, and decodes the second packet data according to the second packet header.

* * * * *